(12) United States Patent
Go et al.

(10) Patent No.: US 10,347,565 B2
(45) Date of Patent: Jul. 9, 2019

(54) MULTI-CHIP PACKAGE OF POWER SEMICONDUCTOR

(71) Applicant: MagnaChip Semiconductor, Ltd., Cheongju-si (KR)

(72) Inventors: Si Hyeon Go, Cheongju-si (KR); Jae Sik Choi, Cheongju-si (KR); Myung Ho Park, Cheongju-si (KR); Dong Seong Oh, Incheon (KR); Beom Su Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/859,988

(22) Filed: Jan. 2, 2018

(65) Prior Publication Data

US 2018/0358285 A1 Dec. 13, 2018

(30) Foreign Application Priority Data

Jun. 12, 2017 (KR) .................. 10-2017-0073293

(51) Int. Cl.
*H01L 23/495* (2006.01)
*H01L 25/07* (2006.01)
*H01L 25/18* (2006.01)
*H01L 29/417* (2006.01)
*H01L 29/423* (2006.01)

(52) U.S. Cl.
CPC .... *H01L 23/4951* (2013.01); *H01L 23/49562* (2013.01); *H01L 23/49575* (2013.01); *H01L 25/07* (2013.01); *H01L 25/18* (2013.01); *H01L 29/41775* (2013.01); *H01L 29/42356* (2013.01); *H01L 2224/16245* (2013.01)

(58) Field of Classification Search
CPC ............ H01L 23/4951; H01L 29/41; H01L 29/417; H01L 29/41725; H01L 29/41775; H01L 33/62
USPC ........................... 257/666–677, 773
See application file for complete search history.

(56) References Cited

U.S. PATENT DOCUMENTS

| | | | | |
|---|---|---|---|---|
| 5,473,188 A | * | 12/1995 | Ando | H01L 23/4951 257/668 |
| 6,524,732 B1 | * | 2/2003 | Iwaizono | H01M 10/42 429/100 |
| 9,123,710 B2 | * | 9/2015 | Uchida | H01L 23/49541 |
| 2005/0161785 A1 | * | 7/2005 | Kawashima | H01L 23/49562 257/678 |
| 2008/0048342 A1 | | 2/2008 | Cheah et al. | |
| 2009/0231811 A1 | * | 9/2009 | Tokuyama | H01L 23/36 361/699 |

(Continued)

*Primary Examiner* — Victoria K. Hall
(74) *Attorney, Agent, or Firm* — NSIP Law

(57) ABSTRACT

A multi-chip package of power semiconductor includes a lead frame, a first segment group, a second segment group, a first power semiconductor chip and a second power semiconductor chip. The lead frame includes a first segment group having a first gate segment, a first source segment, and a first drain segment that are separated from each other. The second segment group has a second gate segment, a second source segment, and a second drain segment that are separated from each other. The first power semiconductor chip is formed on the first segment group. The second power semiconductor chip is formed on the second segment group. The first source segment is physically connected to the second drain segment.

18 Claims, 4 Drawing Sheets

(56) References Cited

U.S. PATENT DOCUMENTS

| | | |
|---|---|---|
| 2010/0258925 A1 | 10/2010 | Jeon et al. |
| 2012/0248526 A1 | 10/2012 | Kinzer et al. |
| 2013/0256807 A1* | 10/2013 | Cho .................. H01L 23/49562 257/379 |
| 2013/0256859 A1* | 10/2013 | Cho .................. H01L 23/49524 257/676 |
| 2015/0001618 A1* | 1/2015 | Hebert .................. H01L 29/781 257/337 |
| 2016/0190114 A1* | 6/2016 | Huang .................... H01L 25/18 257/76 |
| 2017/0162482 A1* | 6/2017 | Kadoguchi ....... H01L 23/49582 |
| 2017/0279366 A1* | 9/2017 | Kimura .................. H01L 25/07 |
| 2018/0012847 A1* | 1/2018 | Onoda .................... H01L 23/40 |

* cited by examiner

MULTI-CHIP PACKAGE OF POWER SEMICONDUCTOR

CROSS-REFERENCE TO RELATED APPLICATIONS

This application claims the benefit under 35 U.S.C. 119(a) of Korean Patent Application No. 10-2017-0073293 filed on Jun. 12, 2017 in the Korean Intellectual Property Office, the entire disclosure of which is incorporated herein by reference for all purposes.

BACKGROUND

1. Field

The present disclosure relates to a multi-chip package of power semiconductor. The present disclosure relates to a multi-chip package of power semiconductor that is able to connect the source of semiconductor chip and a drain electrode that are close to each other without using the wire-bonding or clip-bonding technique.

2. Description of Related Art

The recent power conversion devices such as a converter or inverter require high power density and efficiency. Thus, bridge topologies such as half-bridge topology or full-bridge topology are used for the circuit design. In particular, applications in the field of automotive electronics that include a motor (as well as the recent commercial products) connect multiple devices using different bridge topologies or a multi-chip package of power semiconductor that comprises a circuit in a single package.

Other single chips or multi-chip packages use a surface on which a gate electrode and a source electrode are located on a bottom surface and a drain on a top surface. In addition, other single chips or multi-chip packages connect a drain electrode to its neighboring chip's source electrode through a wire bonding or clip bonding technique.

However, using wire bonding and/or clip bonding method leads to a stray inductance. The wire bonding and/or clip bonding may damage a product by overshooting or resulting in an electromagnetic interference (EMI) that causes performance issues in a system. Overshooting refers to a phenomenon where a drain voltage is increased to be greater than its rated voltage due to the inductance. In addition, the increase of resistance based on the length of wire or clip makes it difficult to produce the high-output by a low on-resistance of packaging of power semiconductor. Therefore, it is necessary to reduce the inductance and the resistance of wire or clip to improve the reliability of products.

In detail, conventional techniques have a structure that includes a low-side drain, a high-side gate, and a high-side source; therefore, it is necessary implement a process of connecting the high-side source and the low-side drain through wire bonding or clip bonding method that is needed to implement a bridge-topology circuit for the operation of a motor in a multi-chip package. Wire bonding is one of processes that causes a severe defect in a power semiconductor packaging. For example, wire bonding causes a fatal defect such as bonding short or open wire in the operations of power semiconductor, which requires a process management that is tightly executed. In addition, the clip-bonding process is characterized by high price of copper clip and risk factors to cause fatal defects, such as a short-circuit fault caused by a clip's floating during the clip-bonding process, a fault of resistance due to an excessive void content under a clip, a chip crack due to the mismatched coefficients of thermal expansion by design, package crack, etc.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multi-chip package of power semiconductor includes a lead frame, a first segment group, a second segment group, a first power semiconductor chip and a second power semiconductor chip. The lead frame includes a first segment group having a first gate segment, a first source segment, and a first drain segment that are separated from each other. The second segment group has a second gate segment, a second source segment, and a second drain segment that are separated from each other. The first power semiconductor chip is formed on the first segment group. The second power semiconductor chip is formed on the second segment group. The first source segment is physically connected to the second drain segment.

The first power semiconductor chip may include a first gate electrode disposed on a first side of the first power semiconductor chip to connect to the first gate segment; a first source electrode disposed on the first side to connect to the first source segment; a first drain contact disposed on the first side to connect to the first drain segment; and a first drain electrode disposed on a second side of the first power semiconductor chip to connect to the first drain contact. The first side may oppose the second side.

The first power semiconductor chip may further include a first gate bump formed between the first gate segment and the first gate electrode; a first source bump formed between the first source segment and the first source electrode; and a first drain bump formed between the first drain segment and the first drain contact.

The first drain contact may be connected to the first drain electrode via a conductive substance.

The first power semiconductor chip and the second power semiconductor chip may be a trench Metal-Oxide-Semiconductor Field-Effect Transistor or an insulated gate bipolar transistor.

The multi-chip package of power semiconductor may be any one or any combination of any two or more of a half-bridge driver circuit, a full-bridge driver circuit, and a 3-phase bridge driver circuit.

In another general aspect, a multi-chip package of power semiconductor includes a first lead frame, and a first power semiconductor chip and a second power semiconductor chip formed on the first lead frame. The first lead frame includes a first source segment; a first gate segment and a first drain segment that are formed to be separated from each other by the first source segment; a first connection segment connected to the first source segment; a second drain segment formed on the first connection segment; and a second gate segment and a second source segment that are formed to be separated from the second drain segment. The first power semiconductor chip and a second power semiconductor chip are formed on the first lead frame. The first power semiconductor chip is attached to the first source segment, the first drain segment, and the first gate segment. The second power semiconductor chip is attached to the second source segment, the second drain segment, and the second gate segment.

The first power semiconductor chip may include a first gate electrode connected to the first gate segment; a first source electrode connected to the first source segment; and a first drain contact connected to the first drain segment.

The second power semiconductor chip may include a second gate electrode connected to the second gate segment; a second source electrode connected to the second source segment; and a second drain contact connected to the second drain segment.

The first power semiconductor chip may further include a first drain electrode formed to correspond to on a reverse side as the first drain contact.

The second power semiconductor chip may further include a second drain electrode formed to correspond to on a reverse side as the second drain contact.

The first power semiconductor chip and the second power semiconductor chip may be placed by a type of flip-chip.

In another general aspect, a multi-chip package of power semiconductor having a lead frame includes segment groups and power semiconductor chips. Each of the segment groups includes a gate segment, a source segment, and a drain segment that are separated from each other. The power semiconductor chips are respectively formed on the segment groups. Each of the power semiconductor chips include a gate electrode disposed on a first side of the power semiconductor chip to connect to the gate segment; a source electrode disposed on the first side to connect to the source segment; a drain contact disposed on the first side to connect to the drain segment; and a drain electrode disposed on a second side of the power semiconductor chip to connect to the drain contact. Adjacent source segments and drain segments of the segment groups are physically connected to each other.

Each of the power semiconductor chip may further include a gate bump formed between the gate segment and the gate electrode; a source bump formed between the source segment and the source electrode; and a drain bump formed between the drain segment and the drain contact.

The drain contact may be connected to the drain electrode via a conductive substance.

At least one of the power semiconductor chips may be a trench Metal-Oxide-Semiconductor Field-Effect Transistor.

At least one of the power semiconductor chips may be an insulated gate bipolar transistor.

The multi-chip package of power semiconductor may be any one or any combination of any two or more of a half-bridge driver circuit, a full-bridge driver circuit, and a 3-phase bridge driver circuit.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
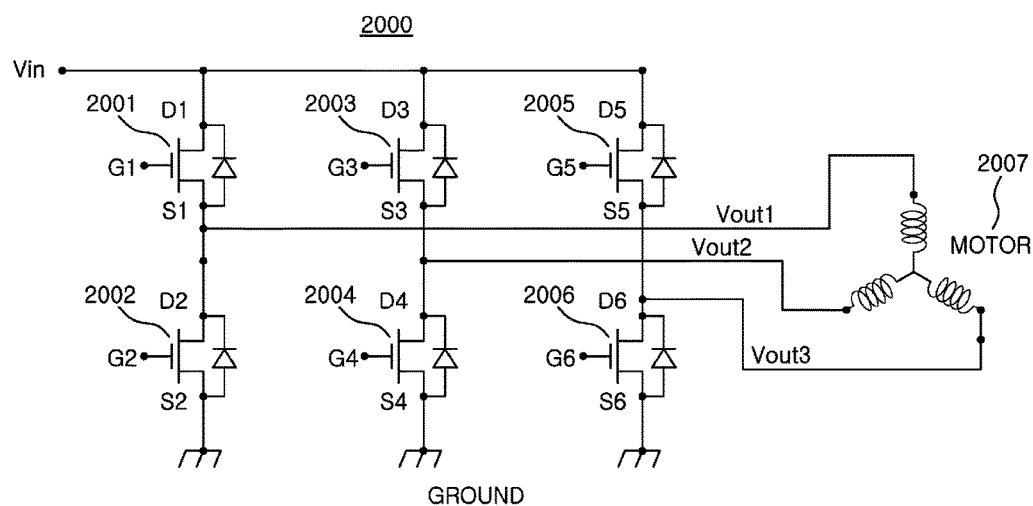
FIG. 1 is a diagram illustrating a motor driver circuit included in an example of a multi-chip package of power semiconductor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram of a motor driver circuit included in an example a multi-chip package of power semiconductor.

As illustrated in FIG. 1, a motor driver circuit 2000 includes a first power semiconductor chip 2001, a second power semiconductor chip 2003, a third power semiconductor chip 2005, a fourth power semiconductor chip 2002, a fifth power semiconductor chip 2004, and a sixth power semiconductor chip 2006. The first power semiconductor chip 2001 includes a first high-side gate electrode G1, a first high-side source electrode S1, and a first high-side drain electrode D1. The second power semiconductor chip 2003 includes a third high-side gate electrode G3, a third high-side source electrode S3, and a third high-side drain electrode D3. The third power semiconductor chip 2005 includes a fifth high-side gate electrode G5, a fifth high-side source electrode S5, and a fifth high-side drain electrode D5. The fourth power semiconductor chip 2002 includes a second low-side gate electrode G2, a second low-side source electrode S2, and a second low-side drain electrode D2. The fifth power semiconductor chip 2004 includes a fourth low-side gate electrode G4, a fourth low-side source electrode S4, and a fourth low-side drain electrode D4. The sixth power semiconductor chip 2006 includes a sixth low-side gate electrode G6, a sixth low-side source electrode S6, and a sixth low-side drain electrode D6. As indicated in the motor driver circuit 2000, the voltage $V_{in}$ is applied to the first high-side drain electrode D1. The first high-side source electrode S1 is electrically connected to the second low-side drain electrode D2, and thus, the voltage $V_{out1}$ is output. In addition, the third high-side source electrode S3 is electrically connected to the fourth low-side drain electrode D4, and thus, the voltage $V_{out2}$ is output. In addition, the fifth high-side source electrode S5 is electrically connected to the sixth low-side drain electrode D6, and thus, the voltage $V_{out3}$ is output. Therefore, a 3-phase motor 2007 may be driven and/or rotated with the voltages $V_{out1}$, $V_{out2}$, $V_{out3}$. The second, fourth, and sixth low-side source electrodes S2, S4, S6 are connected a ground voltage.

The motor driver circuit 2000 is implemented with a multi-chip package of power semiconductor according to an example of the present disclosure. The multi-chip package of power semiconductor may be used for any of the driver circuits such as a half-bridge driver circuit, a full-bridge driver circuit, and a 3-phase bridge driver circuit.

With regulations for energy saving and carbon emission, the use of a brushless DC motor for an electric car, light vehicles such as an electric scooter, and small toy applications such as a drone has remarkably increased. In consequence, the use of an inverter of 3-phase bridge driver circuit has also increased. Examples of the present disclosure are implemented with a multi-chip package of power semiconductor using the power semiconductor chip of six MOSFETs.

Figure 2:
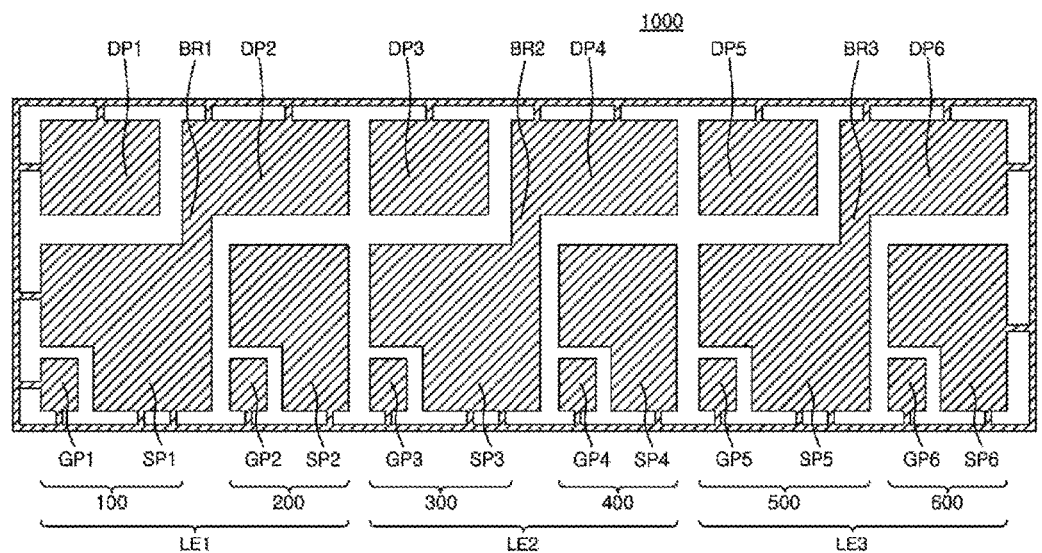
FIG. 2 is a diagram illustrating an example of a lead frame for a multi-chip package of power semiconductor.

FIG. 2 is a diagram illustrating an example of a lead frame for a multi-chip package of power semiconductor.

The multi-chip package of power semiconductor includes a lead frame 1000 having a first segment group 100, a second segment group 200, a third segment group 300, a fourth segment group 400, a fifth segment group 500, and a sixth segment group 600. Referring to FIG. 4B, power semiconductor chips are individually attached on the segment groups 100 to 600. For example, a first power semiconductor chip is placed on the first segment group 100, and a second power semiconductor chip is placed on the second segment group 200.

The combination of first segment group 100 and second segment group 200 is referred to as a first lead frame LE1. Similarly, the combination of third segment group 300 and fourth segment group 400 is referred to as a second lead frame LE2, and the combination of fifth segment group 500 and sixth segment group 600 is referred to as a third lead frame LE3. The whole lead frame 1000 includes at least three lead frames LE1, LE2, LE3. Depending on the design, only the first lead frame LE1 and second lead frame LE2 may be used. For example, the half-bridge driver circuit may include only the first and second lead frames LE1, LE2. In this case, four power semiconductor chips are used. The full-bridge driver circuit or 3-phase driver circuit may include all the first, second, and third lead frames LE1, LE2, LE3. In this case, six power semiconductor chips are used.

The first segment group 100 includes a first gate segment GP1, a first source segment SP1, and a first drain segment DP1 that are formed to be separated from each other. The second segment group 200 includes a second gate segment GP2, a second source segment SP2, and a second drain segment DP2 that are formed to be separated from each other. Segment groups 300, 400, 500 and 600 are configured in the same manner as the first segment group 100.

The first source segment SP1 is physically connected to the second drain segment DP2. Referring to the 3-phase driver circuit illustrated in FIG. 1, the first high-side source electrode S1 is electrically connected to the second low-side drain electrode D2. The first high-side source electrode S1 and second low-side drain electrode D2 are electrically connected to the first source segment SP1 and second drain segment DP2, respectively. Therefore, it is necessary for the first source segment SP1 to be physically connected to the second drain segment DP2.

Similarly, the third source segment SP3 is physically connected to the fourth drain segment DP4. The fifth source segment SP5 is physically connected to the sixth drain segment DP6. Here, the segment comprises conductive metal materials and is referred to as a paddle. The area of source segment is larger than the area of drain segment. In FIG. 2, the first lead frame LE1 may further include a first connection segment BR1 that is connected to the first source segment SP1. The first source segment SP1 is physically and electrically connected to the second drain segment DP2 by the first connection segment BR1. A second connection segment BR2 and a third connection segment BR3 are explained in the same manner as the first connection segment BR1.

Figure 3:
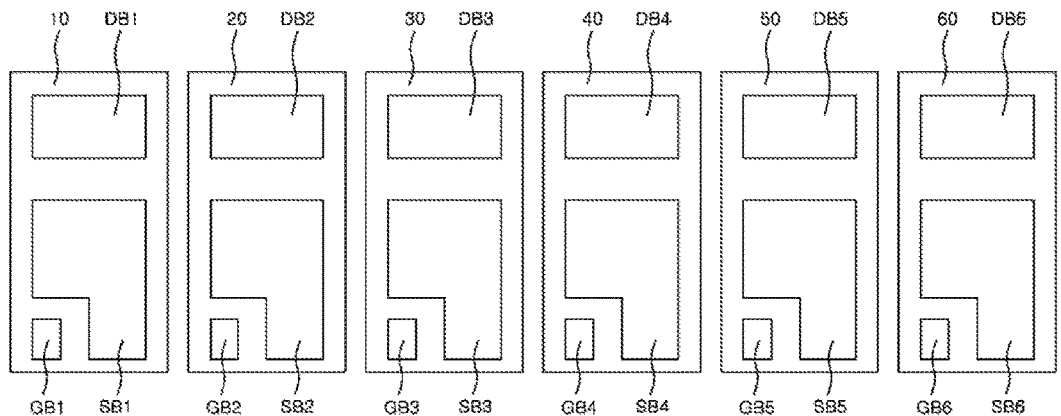
FIG. 3 is a diagram illustrating an example of a plurality of power semiconductor chips.

FIG. 3 is a diagram illustrating an example of a plurality of power semiconductor chips.

As illustrated in FIG. 3, respective power semiconductor chips include a gate bump, a source bump, and a drain bump that are formed to be separated from each other. All the bumps comprise metal materials.

A first power semiconductor chip 10 includes a first gate bump GB1, a first source bump SB1, and a first drain bump DB1. A second power semiconductor chip 20 includes a second gate bump GB2, a second source bump SB2, and a second drain bump DB2. A third power semiconductor chip 30 includes a third gate bump GB3, a third source bump SB3, and a third drain bump DB3; a fourth power semiconductor chip 40 includes a fourth gate bump GB4, a fourth source bump SB4, and a fourth drain bump DB4; a fifth power semiconductor chip 50 includes a fifth gate bump GB5, a fifth source bump SB5, and a fifth drain bump DB5; and a sixth power semiconductor chip 60 includes a sixth gate bump GB6, a sixth source bump SB6, and a sixth drain bump DB6. Each gate bump, source bump, and drain bump is arranged to respectively correspond to each gate segment, source segment, and drain segment of each lead frame. In addition, each gate bump, source bump, and drain bump is arranged to respectively correspond to each gate electrode, source electrode, and drain electrode of the power semiconductor chips. As a result, the gate electrode, source electrode, and drain electrode of the power semiconductor chips are arranged to respectively correspond to the gate segment, source segment, and drain segment of the lead frames.

Figure 4A:
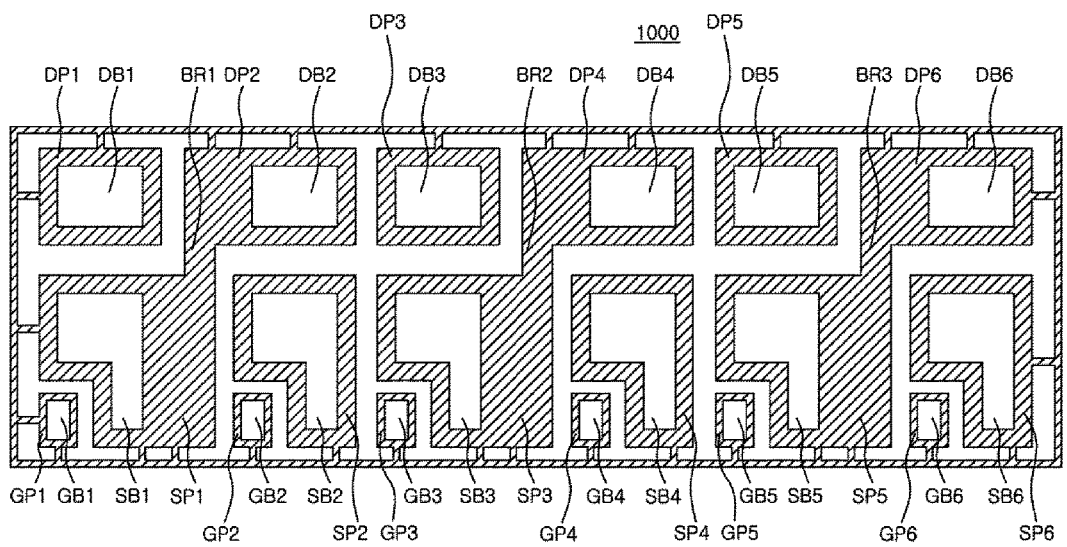
FIG. 4A is a diagram illustrating an example of an overlap of a lead frame for a multi-chip package of power semiconductor and the lower part of a plurality of power semiconductor chips.
Figure 4B:
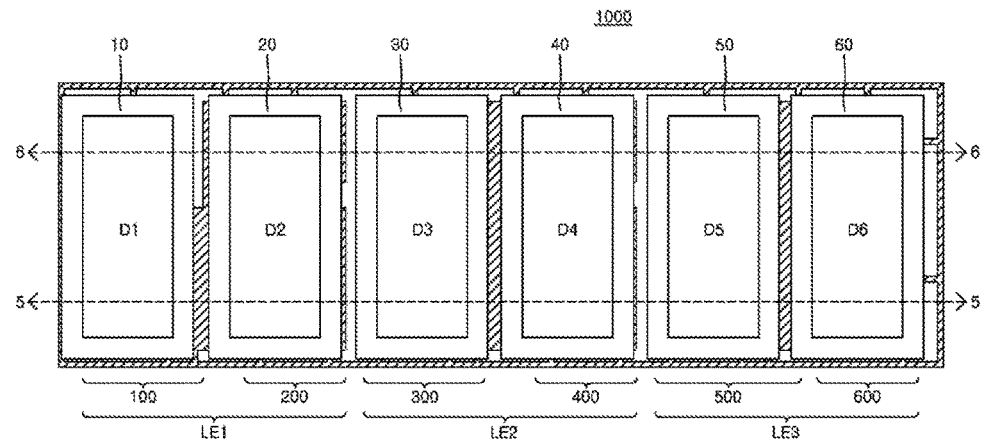
FIG. 4B is a diagram illustrating an example of an overlap of a lead frame for a multi-chip package of power semiconductor and a plurality of power semiconductor chips.

FIG. 4A is a diagram illustrating an overlap of an example of a lead frame for a multi-chip package of power semiconductor and the lower part of a plurality of power semiconductor chips.

Figure 5:
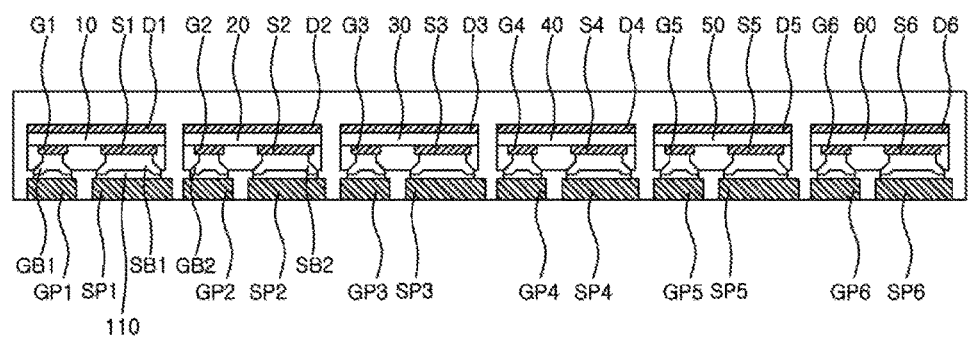
FIG. 5 is a cross-sectional diagram illustrating an example of the multi-chip package of power semiconductor of FIG. 4B along line 5-5.
Figure 6:
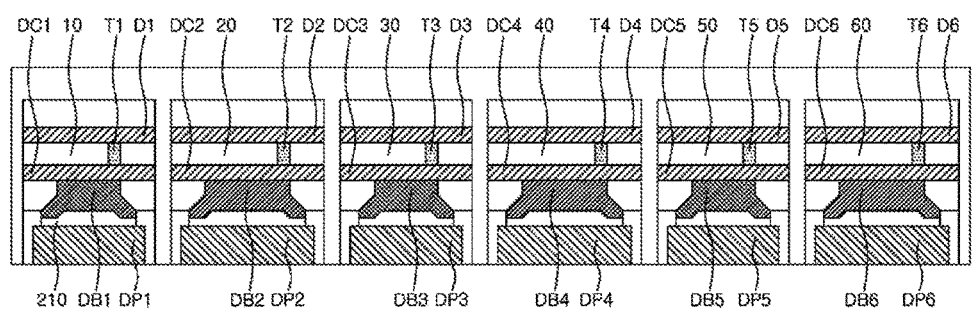
FIG. 6 is a cross-sectional diagram illustrating an example of the multi-chip package of power semiconductor of FIG. 4B along line 6-6.

As illustrated in FIG. 4A, the first gate bump GB1 is placed on the first gate segment GP1. As depicted in FIG. 5, the first gate segment GP1 is electrically connected to the first gate bump GB1 via a solder material 110. The first source bump SB1 is placed on the first source segment SP1. As depicted in FIG. 5, the first source segment SP1 is electrically connected to the first source bump SB1 via the solder material 110. The first drain bump DB1 is placed on the first drain segment DP1. As depicted in FIG. 6, the first drain segment DP1 is electrically connected to the first drain bump DB1 via the solder material 210. The second to sixth gate bumps GB2, GB3, GB4, GB5, GB6, the second to sixth source bumps SB2, SB3, SB4, SB5, SB6, and the second to sixth drain bumps DB2, DB3, DB4, DB5, DB6 are explained in the same manner as the first gate bump GB1, the first source bump SB1, and the first drain bump DB1; thus, the description thereof is omitted.

FIG. 4B is a diagram illustrating an overlap of an example of a lead frame for a multi-chip package of power semiconductor and a plurality of power semiconductor chips.

FIG. 4B shows the placing of each power semiconductor chip on a respective lead frame. The first power semiconductor chip 10 is placed on the first segment group 100. The second power semiconductor chip 20 is placed on the second segment group 200. The other power semiconductor chips 30, 40, 50, 60 are placed on the third, fourth, fifth, and sixth segment group 300, 400, 500, 600, respectively. The first and second power semiconductor chips 10, 20 are placed to the first lead frame LE1. The third and fourth power semiconductor chips 30, 40 are placed to the second lead frame LE2. The fifth and sixth power semiconductor chips 50, 60 are placed to the third lead frame LE3.

The first high-side drain electrode D1, second low-side drain electrode D2, third high-side drain electrode D3, fourth low-side drain electrode D4, fifth high-side drain electrode D5, and sixth low-side drain electrode D6 are formed on the surface of respective power semiconductor chips and will be described later. Referring to FIG. 6, the drain electrodes D1 to D6 are electrically connected to drain contacts DC1 to DC6 via a penetration hole or interconnect structures T1 to T6.

In general, a gate electrode and a source electrode are formed on one side of a power semiconductor chip and a drain electrode is formed on the other side thereof. In contrast, according to examples of the present disclosure, a gate electrode, a source electrode, and a drain contact are formed on one side of a power semiconductor chip together. Therefore, the clip bonding or wire bonding for connection to a drain electrode formed on the other side is not necessary.

Accordingly, it is possible to provide a multi-chip package of power semiconductor that is capable of improving the reliability of product by reducing the resistance of wire or clip. In addition, since recent systems are easily influenced by the issue of Electro Magnetic Interference (EMI) due to the voltage spike and noise resulting from the stray inductance, an effort to minimize the stray inductance is made. Therefore, examples of the present disclosure make it possible to delete the wire bonding and/or clip-bonding step between the high and low sides which causes the occurrence of high stray inductance and to provide a multi-chip package of power semiconductor in which lower stray inductance is achieved by bonding the source and the drain via the lead frame.

FIG. 5 is a cross-sectional diagram illustrating an example of the multi-chip package of power semiconductor of FIG. 4B along line 5-5.

FIG. 5 is the cross-section made by cutting along the line 5-5 in FIG. 4B. As illustrated in FIG. 5, the first power semiconductor chip 10 includes the first gate electrode G1 and the first source electrode S1 that are formed on a first side and the first drain electrode D1 formed on a second side. The first gate electrode G1 is connected to the first gate bump GB1 and is electrically connected to the first gate segment GP1 via the solder material 110. Similarly, the first source electrode S1 is connected to the first source bump SB1 and is electrically connected to the first source segment SP1 via the solder material 110.

Herein, the power semiconductor chip is characterized by the use of a trench MOSFET or insulated gate bipolar transistor, and it is packaged as a flip chip. For example, a chip is disposed so that a gate electrode and a source electrode face toward the bottom side, which is referred to as a first side, and a drain electrode faces towards the top side, which is referred to as a second side. The general chip is disposed so that a gate electrode and a source electrode faces toward the top and a drain electrode is placed under the bottom side. In this description, the first side refers to the bottom side, and the second side refers to a side that is above the first side. For convenience, referring to FIG. 6, the drain electrodes that are formed on the first side are referred to as a first to sixth drain contacts DC1 to DC6, and the drain electrodes that are formed on the second side are referred to as a first to sixth drain electrodes D1 to D6. The first to sixth drain electrodes D1 to D6, which are formed on the second side in FIG. 6, correspond to the drain electrodes D1 to D6, which are shown on the circuit of FIG. 1. The first to sixth drain contacts D1 to D6 may be addressed as an upper drain pad or upper drain contact. Hereinafter, in order to clearly distinguish drain contacts DC1 to DC6 from drain electrodes that are formed on the second side D1 to D6, they are addressed as 'drain contact.'

FIG. 6 is a cross-sectional diagram illustrating an example of the multi-chip package of power semiconductor of FIG. 4B along line 6-6.

FIG. 6 is a cross-section made by cutting along the line 6-6 in FIG. 4B. As illustrated in FIG. 6, the first drain electrode D1 formed on the second side of first power semiconductor chip 10 is electrically connected to the first drain contact DC1 via a penetration hole or interconnect structure T1. The penetration hole or interconnect structure may compose a structure that is filled with conductive materials or a metal wire. In addition, the first drain contact DC1 is connected to the first drain bump DB1. The first drain bump DB1 is electrically connected to the first drain segment DP1 via a solder material 210. In the end, the first drain electrode D1 is electrically connected to the first drain segment DP1. The second to sixth drain electrodes D2 to D6 are described in the same manner as first drain electrode D1, so the description thereof is omitted.

Figure 7A:
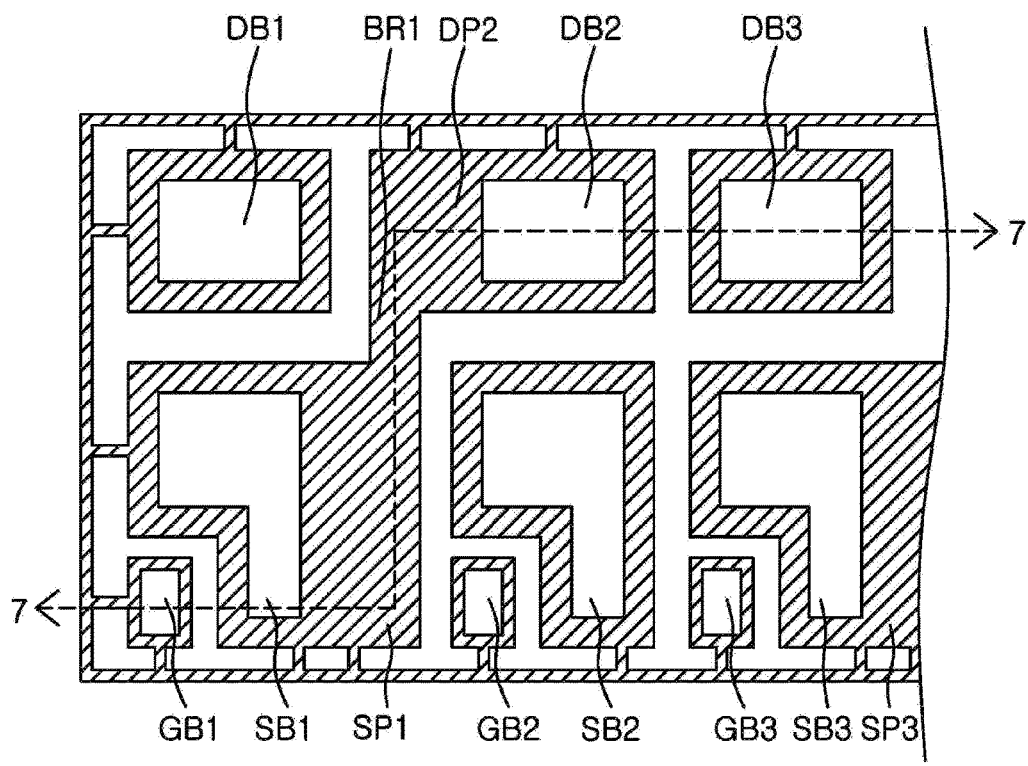
FIG. 7A is a diagram illustrating an example of an overlap of a lead frame for multi-chip package of power semiconductor and the lower part of a plurality of power semiconductor chips.

FIG. 7A is a diagram illustrating an overlap of an example of a lead frame for multi-chip package of power semiconductor and the lower part of a plurality of power semiconductor chips. The detailed description is omitted because it is presented above when FIG. 4A is described. It should be noted that the first source segment SP1 is physically connected to the second drain segment DP2 via the first connection segment BR1. The first connection segment BR1 is a connection bridge that connects the first source segment SP1 and the second drain segment DP2.

Figure 7B:
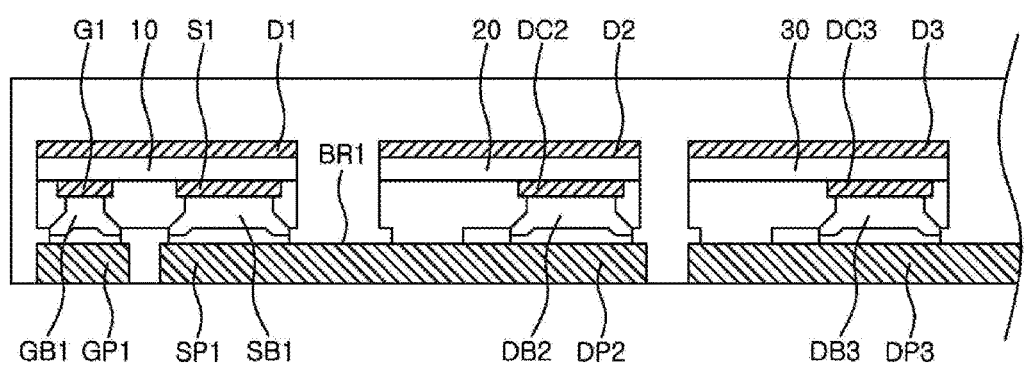
FIG. 7B is a diagram illustrating an example of the overlap of the lead frame for multi-chip package of power semiconductor and the plurality of power semiconductor chips of FIG. 7A along line 7-7.

FIG. 7B is a diagram illustrating an overlap of an example of the lead frame for multi-chip package of power semiconductor and the plurality of power semiconductor chips of FIG. 7A along line 7-7.

FIG. 7B is a cross-section made by cutting along the line 7-7 in FIG. 7A. The first source segment SP1 is physically and electrically connected to the second drain segment DP2 via the first connection segment BR1, which is in order to output $V_{out}$ to drive a motor 2007 as illustrated in FIG. 1.

The examples presented above disclose a multi-chip package of power semiconductor that is able to increase the reliability of products by reducing the inductance and resistance of a wire or clip by bonding a gate electrode, a source electrode, and a drain electrode.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multi-chip package of power semiconductor, comprising:
    a lead frame comprising:
        a first segment group having a first gate segment, a first source segment, and a first drain segment that are separated from each other; and
        a second segment group having a second gate segment, a second source segment, and a second drain segment that are separated from each other;
    a first power semiconductor chip formed on the first segment group; and
    a second power semiconductor chip formed on the second segment group, wherein the first source segment is physically connected to the second drain segment.

2. The multi-chip package of power semiconductor of claim 1, wherein the first power semiconductor chip comprises:
    a first gate electrode disposed on a first side of the first power semiconductor chip to connect to the first gate segment;
    a first source electrode disposed on the first side to connect to the first source segment;
    a first drain contact disposed on the first side to connect to the first drain segment; and
    a first drain electrode disposed on a second side of the first power semiconductor chip to connect to the first drain contact, and
    wherein the first side opposes the second side.

3. The multi-chip package of power semiconductor of claim 2, wherein the first power semiconductor chip further comprises:
    a first gate bump formed between the first gate segment and the first gate electrode;
    a first source bump formed between the first source segment and the first source electrode; and
    a first drain bump formed between the first drain segment and the first drain contact.

4. The multi-chip package of power semiconductor of claim 2, wherein the first drain contact is connected to the first drain electrode via a conductive substance.

5. The multi-chip package of power semiconductor of claim 1, wherein the first power semiconductor chip and the second power semiconductor chip are a trench Metal-Oxide-Semiconductor Field-Effect Transistor or an insulated gate bipolar transistor.

6. The multi-chip package of power semiconductor of claim 1, wherein the multi-chip package of power semiconductor is any one or any combination of any two or more of a half-bridge driver circuit, a full-bridge driver circuit, and a 3-phase bridge driver circuit.

7. A multi-chip package of power semiconductor, comprising:
    a first lead frame, comprising:
        a first source segment;
        a first gate segment and a first drain segment that are formed to be separated from each other by the first source segment;
        a first connection segment connected to the first source segment;
        a second drain segment formed on the first connection segment; and a second gate segment and a second source segment that are formed to be separated from the second drain segment; and a first power semiconductor chip and a second power semiconductor chip formed on the first lead frame, wherein the first power semiconductor chip is attached to the first source segment, the first drain segment, and the first gate segment, and wherein the second power semiconductor chip is attached to the second source segment, the second drain segment, and the second gate segment.

8. The multi-chip package of power semiconductor of claim 7, wherein the first power semiconductor chip comprises:
 a first gate electrode connected to the first gate segment;
 a first source electrode connected to the first source segment; and
 a first drain contact connected to the first drain segment.

9. The multi-chip package of power semiconductor of claim 7, wherein the second power semiconductor chip comprises:
 a second gate electrode connected to the second gate segment;
 a second source electrode connected to the second source segment; and
 a second drain contact connected to the second drain segment.

10. The multi-chip package of power semiconductor of claim 8, wherein the first power semiconductor chip further comprises a first drain electrode formed to correspond to a reverse side of the first drain contact.

11. The multi-chip package of power semiconductor of claim 9, wherein the second power semiconductor chip further comprises a second drain electrode formed to correspond to a reverse side of the second drain contact.

12. The multi-chip package of power semiconductor of claim 7, wherein the first power semiconductor chip and the second power semiconductor chip are placed by a type of flip-chip.

13. A multi-chip package of power semiconductor having a lead frame, the lead frame comprising:

segment groups each comprising a gate segment, a source segment, and a drain segment that are separated from each other; and power semiconductor chips respectively formed on the segment groups, each of the power semiconductor chips comprising:
 a gate electrode disposed on a first side of the power semiconductor chip to connect to the gate segment;
 a source electrode disposed on the first side to connect to the source segment;
 a drain contact disposed on the first side to connect to the drain segment; and
 a drain electrode disposed on a second side of the power semiconductor chip to connect to the drain contact,
wherein alternate groups of source segments and drain segments of the segment groups are physically connected to each other.

14. The multi-chip package of power semiconductor of claim 13, wherein each of the power semiconductor chips further comprises:
 a gate bump formed between the gate segment and the gate electrode;
 a source bump formed between the source segment and the source electrode; and
 a drain bump formed between the drain segment and the drain contact.

15. The multi-chip package of power semiconductor of claim 14, wherein a conductive substance connects the drain contact to the drain electrode.

16. The multi-chip package of power semiconductor of claim 14, wherein at least one of the power semiconductor chips is a trench Metal-Oxide-Semiconductor Field-Effect Transistor.

17. The multi-chip package of power semiconductor of claim 14, wherein at least one of the power semiconductor chips is an insulated gate bipolar transistor.

18. The multi-chip package of power semiconductor of claim 14, wherein the multi-chip package of power semiconductor is any one or any combination of any two or more of a half-bridge driver circuit, a full-bridge driver circuit, and a 3-phase bridge driver circuit.

* * * * *